United States Patent
Lee et al.

(10) Patent No.: US 11,869,598 B2
(45) Date of Patent: Jan. 9, 2024

(54) NONVOLATILE MEMORY DEVICES HAVING ADAPTIVE WRITE/READ CONTROL TO IMPROVE READ RELIABILITY AND METHODS OF OPERATING THE SAME

(71) Applicant: Samsung Electronics Co., Ltd., Suwon-si (KR)

(72) Inventors: Jihwa Lee, Namyangju-si (KR); Youhwan Kim, Ansan-si (KR); Kyungduk Lee, Seongnam-si (KR); Hosung Ahn, Gwangmyeong-si (KR)

(73) Assignee: Samsung Electronics Co., Ltd.

( * ) Notice: Subject to any disclaimer, the term of this patent is extended or adjusted under 35 U.S.C. 154(b) by 105 days.

(21) Appl. No.: 17/579,902

(22) Filed: Jan. 20, 2022

(65) Prior Publication Data

US 2022/0415404 A1    Dec. 29, 2022

(30) Foreign Application Priority Data

Jun. 25, 2021  (KR) .................. 10-2021-0083119

(51) Int. Cl.
| | | |
|---|---|---|
| *G11C 16/16* | (2006.01) | |
| *G11C 16/10* | (2006.01) | |
| *G11C 16/08* | (2006.01) | |
| *G11C 16/30* | (2006.01) | |
| *G11C 16/28* | (2006.01) | |

(52) U.S. Cl.
CPC .............. *G11C 16/16* (2013.01); *G11C 16/08* (2013.01); *G11C 16/105* (2013.01); *G11C 16/28* (2013.01); *G11C 16/30* (2013.01)

(58) Field of Classification Search
None
See application file for complete search history.

(56) References Cited

U.S. PATENT DOCUMENTS

| | | | |
|---|---|---|---|
| 8,996,768 B2 | 3/2015 | Cohen et al. | |
| 9,633,738 B1* | 4/2017 | Guo | G11C 16/30 |
| 9,972,375 B2 | 5/2018 | Parks et al. | |
| 10,008,272 B2 | 6/2018 | Kang et al. | |
| 10,409,717 B2 | 9/2019 | Hsu | |
| 11,462,273 B2* | 10/2022 | Doller | G11C 16/3445 |
| 2016/0034217 A1 | 2/2016 | Kim et al. | |
| 2021/0019088 A1 | 1/2021 | Zhu et al. | |

FOREIGN PATENT DOCUMENTS

KR    102027543 B1    10/2019

\* cited by examiner

*Primary Examiner* — Kretelia Graham
(74) *Attorney, Agent, or Firm* — Myers Bigel, P.A.

(57) ABSTRACT

A storage device includes a controller configured to control a non-volatile memory device(s) having a plurality of memory blocks therein. The controller includes secure erase control logic configured to: (i) control secure erase operations on the plurality of memory blocks in response to a secure erase request received from a host, and (ii) set flags corresponding to the plurality of memory blocks such that a first flag corresponding to a first memory block, which has undergone at least two of the secure erase operations, has a first value. Adaptive control logic is provided, which is configured to change at least one operating condition associated with a write operation and/or read operation directed at the first memory block, in response to detecting that the first flag has the first value.

20 Claims, 20 Drawing Sheets

FIG. 12A

| READ OFFSET | ADAPTIVE READ LEVEL | | | | | | |
|---|---|---|---|---|---|---|---|
| | P0 | P1 | P2 | P3 | P4 | P5 | P6 |
| | Δ200mV | Δ100mV | Δ50mV | Δ50mV | Δ25mV | Δ10mV | Δ0mV |

FIG. 14

| | \ | 0 | 1 | 2 | 3 | 4 |
|---|---|---|---|---|---|---|
| | | \multicolumn{5}{c|}{NUMBER OF SECURE ERASE OPERATIONS} |
| VERS OFFSET | | 0mV | −100mV | −100mV | −200mV | −200mV |
| ERASE TIME OFFSET | | 0us | −10us | −20us | −20us | −30us |
| VPGM OFFSET | | 0mV | 50mV | 50mV | 100mV | 100mV |
| PROGRAM TIME OFFSET | | 0us | 0us | 5us | 5us | 10us |

NONVOLATILE MEMORY DEVICES HAVING ADAPTIVE WRITE/READ CONTROL TO IMPROVE READ RELIABILITY AND METHODS OF OPERATING THE SAME

REFERENCE TO PRIORITY APPLICATION

This application claims priority under 35 U.S.C. § 119 to Korean Patent Application No. 10-2021-0083119, filed Jun. 25, 2021, the disclosure of which is hereby incorporated herein by reference.

BACKGROUND

The inventive concept relates to a storage device and, more particularly, to a controller for performing a secure erase operation within a storage device, a storage device including the same, and a method of operating the storage device.

As a non-volatile memory, flash memory may retain data stored therein even when power thereto is cut off. Storage devices, such as solid state drives (SSDs) and memory cards, including flash memory are widely used. Storage devices are useful for storing or moving a large amount of data. As storage devices are widely used in various fields, the security of data stored in storage devices is increasingly important. In particular, in a computing system using a storage device, even if a user deletes data, information corresponding to the data may physically remain in the storage device. In general, in the case where data is repeatedly erased to thereby safely delete the data, a relatively high frequency of erasure can cause threshold voltage distribution characteristics to deteriorate. In this case, data reliability may be decreased when programming or reading data to or from a memory block.

SUMMARY

The inventive concept provides a storage device that can reduce or prevent a decrease in data reliability of a memory block that has deteriorated in response to a repetition of secure erase operations, and a method of operating the storage device.

According to an aspect of the inventive concept, there is provided a storage device including a controller configured to control a non-volatile memory device including a plurality of blocks. The controller may include a secure erase control logic configured to control a secure erase operation on the plurality of blocks in response to a secure erase request from a host, and may set flags corresponding to the plurality of blocks, such that a flag corresponding to a block that has been requested to undergo at least two secure erase operations among the plurality of blocks has a first value. Adaptive control logic is provided, which is configured to perform a control operation such that an operating condition of at least one selected from a write operation and a read operation is changed from a normal write operation or a normal read operation when a flag corresponding to a first block has the first value, the first block is subject to the write or read request (from the host).

According to another aspect of the inventive concept, there is provided an operating method of a storage device controlling a memory operation of a non-volatile memory device including a plurality of blocks. The operating method includes performing a secure erase operation on the plurality of blocks in response to a secure erase request from a host, and setting flags corresponding to the plurality of blocks such that a flag corresponding to a block that has been requested to undergo at least two consecutive secure erase operations among the plurality of blocks has a first value. In addition, a write operation or a read operation is performed on a first block after changing at least one operating condition compared to a normal write or a normal read operation when a flag corresponding to the first block has the first value.

According to a further aspect of the inventive concept, there is provided a method of operating a storage device, which includes controlling a memory operation of a non-volatile memory device having a plurality of memory blocks therein. The operating method includes performing a secure erase operation on the plurality of memory blocks in response to a secure erase request from a host, and counting a number of secure erase operations performed on the plurality of memory blocks. A normal write operation or a write operation having a changed operating condition may then be performed on a first memory block based on a count value of the first block corresponding to a write request from the host, and an erase operation and a program operation may be sequentially performed on the first memory block in response to the write request from the host.

According to another aspect of the inventive concept, a method of operating a nonvolatile memory device includes performing a normal write operation on a first memory block within the nonvolatile memory device, and thereafter performing a secure erase operation on the first memory block by: (i) performing a plurality of consecutive erase operations on the first memory block, and (ii) setting a flag associated with the first memory block, which indicates that the first memory block has undergone the secure erase operation. Thereafter, a modified write operation is performed on the first memory block using at least one modified write operating condition relative to the normal write operation, in response to detecting the set flag associated with the first memory block. The performance of the modified write operation may also include resetting the flag associated with the first memory block, and may be followed by performing a normal write operation on the first memory block. In order to improve program reliability, the at least one modified write operating condition accounts for an over-erase condition within the first memory block, which is caused by the secure erase operation.

BRIEF DESCRIPTION OF THE DRAWINGS

Embodiments of the inventive concept will be more clearly understood from the following detailed description taken in conjunction with the accompanying drawings in which:

FIG. 11 and FIGS. 12A and 12B illustrate an adaptive control method in a read operation;

FIGS. 13 through 15 illustrate an adaptive control method in a read operation;

DETAILED DESCRIPTION OF THE EMBODIMENTS

Hereinafter, embodiments will be described in detail with reference to the accompanying drawings.

Figure 1:
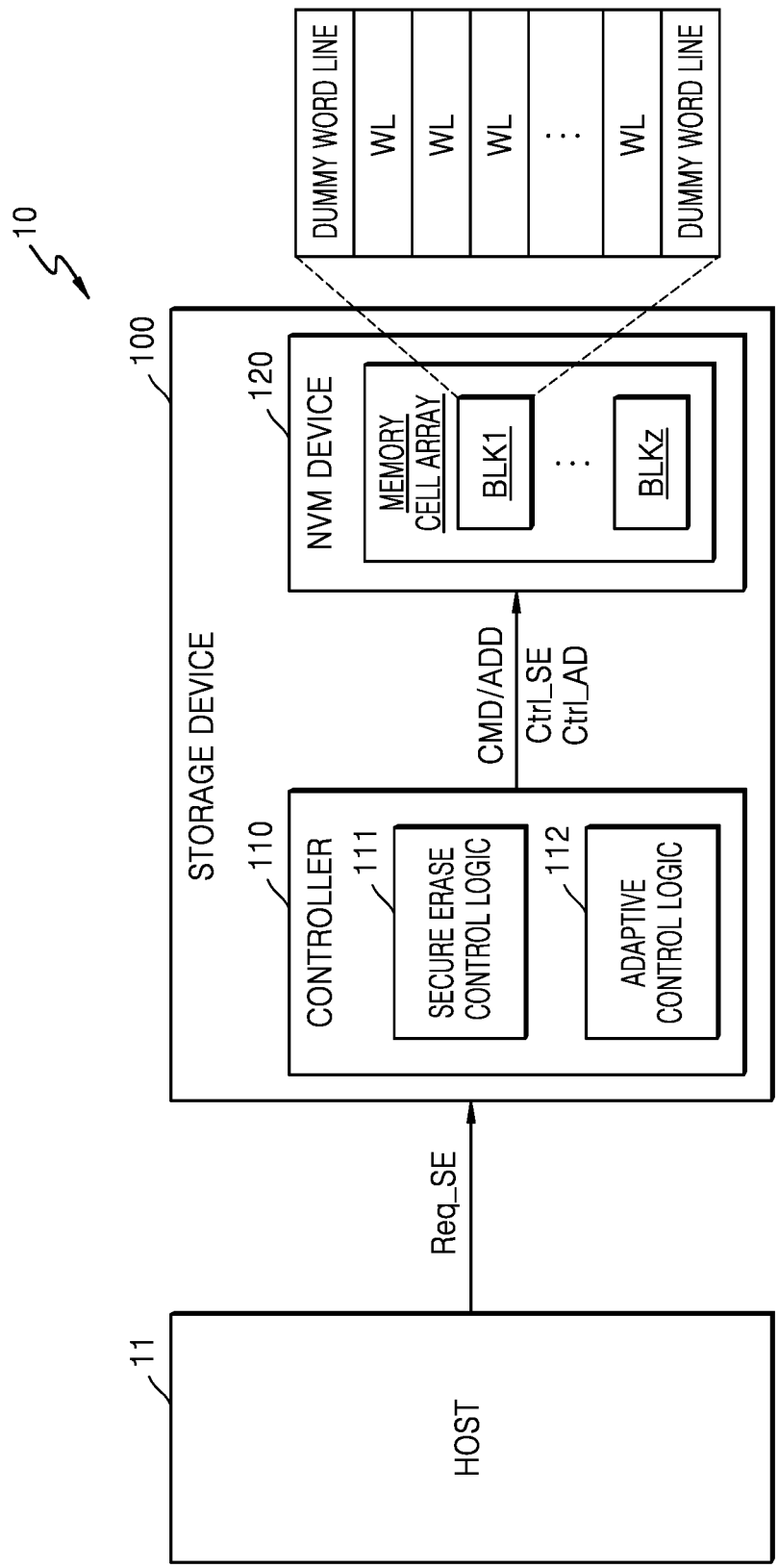
FIG. 1 is a block diagram of a storage system according to an embodiment.

FIG. 1 is a block diagram of a storage system 10 according to an embodiment. Referring to FIG. 1, the storage system 10 may include a storage device 100 and a host 11. The storage device 100 may include a controller 110 and a non-volatile memory (NVM) device 120. The storage device 100 may communicate with the host 11 via various interfaces. For example, the host 11 may include an application processor (AP) or a system-on-chip (SoC). The storage device 100 may communicate with the host 11 via various interfaces such as a universal serial bus (USB) interface, a multimedia card (MMC) interface, an embedded MMC (eMMC) interface, a peripheral component interconnection (PCI) interface, a PCI-express (PCI-E) interface, an advanced technology attachment (ATA) interface, a serial-ATA interface, a parallel-ATA interface, a small computer small interface (SCSI), an enhanced small disk interface (ESDI), an integrated drive electronics (IDE) interface, Firewire, a universal flash storage (UFS) interface, and an NVM express (NVMe) interface.

The NVM device 120 may include NVM such as NAND flash memory, vertical NAND flash memory, NOR flash memory, resistive random access memory (RAM), phase-change memory, or magnetoresistive RAM, however, other types of nonvolatile memory may also be used. The controller 110 may perform a control operation in response to a request from the host 11 such that data is written to or read from the NVM device 120. For example, the controller 110 may control data write and read operations of the NVM device 120 or an erase operation, in which data is erased from the NVM device 120.

The NVM device 120 may include a memory cell array. The memory cell array may include a plurality of memory blocks, such as first to z-th blocks BLK1 to BLKz. Each of the memory blocks may include a plurality of word lines and at least one dummy word line, and memory cells connected to each word line may form a single page. User data may be stored in a page corresponding to each of the word lines, whereas legitimate data may not be stored in a page corresponding to the dummy word line.

The controller 110 may perform a control operation on the NVM device 120 based on various units. For example, a memory block may be an erase unit, and a page may be a write unit and a read unit. The controller 110 may provide a command CMD and an address ADD to the NVM device 120 to execute various requests from the host 11.

The storage system 10 may include, for example, a personal computer (PC), a data server, network-attached storage (NAS), an Internet of things (IoT) device, or a portable electronic device. The portable electronic device may include a laptop computer, a mobile phone, a smart-phone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, or a wearable device.

According to an example embodiment, the storage device 100 may receive, from the host 11, a secure erase request Req_SE with respect to data. And, in response to the secure erase request Req_SE, the storage device 100 may support a function of securely erasing the data, which is selected by a user, such that the erased data cannot be restored. The storage device 100 may receive the secure erase request Req_SE from the host 11 via various kinds of interfaces. For example, the storage device 100 may receive various requests related to a secure erase based on the value of a secure erase setting (SES) field defined in the NVMe interface.

When receiving the secure erase request Req_SE from the host 11, the storage device 100 may perform a series of processing operations to physically erase the data selected by a user. According to an implementation, the host 11 may include a configuration for selecting data that a user wants to securely erase. For example, a host application capable of generating a request for a secure erase may be installed in the host 11, and a user may run the host application and select data to be securely erased. The series of processing operations of securely erasing data according to embodiments may be defined by various terms. For convenience of description, the series of processing operations may be defined as being included in a secure erase operation in the embodiments below.

According to an example embodiment, the controller 110 may include a secure erase control logic 111 and an adaptive control logic 112. Each of the secure erase control logic 111 and the adaptive control logic 112 may be implemented by hardware, software, or a combination thereof. For example, when each of the secure erase control logic 111 and the adaptive control logic 112 is implemented by software including firmware, the controller 110 may include at least one processor (not shown) executing the software and memory (not shown) storing the software, and each of the secure erase control logic 111 and the adaptive control logic 112 may be loaded to the memory as software. According to an embodiment, the controller 110 may include a flash translation layer (FTL), and at least part of the function of each of the secure erase control logic 111 and the adaptive control logic 112 may be included in the FTL.

In an example embodiment, the concept of the term "adaptive control" may include various control operations related to changing the conditions of write and read operations performed on a memory block that has deteriorated by at least two secure erase operations. In the descriptions of embodiments, the concept including the control operations may be defined as other various terms than the "adaptive control".

The secure erase control logic 111 may output a secure erase control signal Ctrl_SE and control a series of operations to securely erase data selected by a user. When the secure erase request Req_SE with respect to at least one memory block is received from the host 11, the secure erase control logic 111 may control an erase operation on data stored in the memory block. For example, after performing an erase operation on a memory block, the secure erase control logic 111 may perform a control operation such that a program operation (e.g., one-shot programming) is performed to program the memory cells of the memory block to have a certain threshold voltage distribution.

According to an example embodiment, the adaptive control logic 112 may perform a control operation to adaptively control a memory operation such as a write or read operation. For example, the adaptive control logic 112 may output an adaptive control signal Ctrl_AD, based on a result of determining the secure erase state and/or deterioration degree of a memory block, with respect to which a write or a read has been requested, to differently control the conditions of the write or read operation. The controller 110 may control the secure erase operation and the write or read operation on the NVM device 120 by providing the command CMD, the address ADD, the secure erase control signal Ctrl_SE, and the adaptive control signal Ctrl_AD to the NVM device 120 based on the control results of the secure erase control logic 111 and the adaptive control logic 112.

Usually, each time when the storage device 100 receives the secure erase request Req_SE from the host 11, the storage device 100 may repeatedly perform physical erase operations on a memory block that corresponds to the secure erase request Req_SE. When multiple secure erase operations are repeatedly performed on one memory block, the threshold voltage distribution of the memory cells of the memory block may gradually change (or shift to the left). This change of the threshold voltage distribution may cause a decrease in data reliability when a subsequent write or read operation is thereafter performed on the memory block.

When embodiments are described with respect to a first memory block, information (e.g., a flag (not shown)) indicating whether multiple secure erase operations have been performed on the first memory block may be stored in the storage device 100. The secure erase control logic 111 may determine whether at least two secure erase operations have been consecutively requested or performed with respect to the first memory block and set a flag corresponding to the first memory block to a value of "1" based on a determination result. Whether at least two secure erase operations have been requested may be determined in various ways. For example, when the secure erase request Req_SE is received two consecutive times with respect to the first memory block, it may be determined that at least two secure erase operations have been requested. However, embodiments are not limited thereto. Moreover, even when, after the secure erase request Req_SE is received the first time, the secure erase request Req_SE is received a second time after an intermediate request (e.g., a read request) is received, which does not change the threshold voltage distribution of the first memory block, the flag corresponding to the first memory block may still be set to a value of "1". The number of secure erase operations, based on which the flag is set to "1", may be set to 2 or other various values greater than 2.

When a write or read request for the first memory block is received, the secure erase state and/or deterioration degree of the first memory block may first be evaluated/determined, and then the requested write or read operation may be adaptively controlled based on the result of the evaluation/determination.

As described hereinabove, when the threshold voltage distribution of a particular memory block deteriorates in response to the performance of multiple secure erase operations on the particular memory block, the threshold voltage distribution may thereafter be controlled to be shifted to an appropriate position by adaptively adjusting properties of a write operation, and data within the corresponding memory block may be controlled to be read using an optimal read level(s) by adaptively adjusting properties of a read operation. In an example embodiment, to determine about the deterioration of the particular (e.g., first) memory block, the flag corresponding to the particular memory block may be first referenced and evaluated. The deterioration degree of the first memory block may be determined by analyzing the threshold voltage distribution of the memory cells of the first memory block. In an example operation, when the flag corresponding to the first memory block is "1", the deterioration degree of the first memory block may be determined based on the threshold voltage distribution of the memory cells of the first memory block, and an adaptive write and/or read operation may be performed on the first memory block according to the deterioration degree.

According to the present example embodiment, write and read operations may be adaptively performed based on a result of determining the secure erase state and/or deterioration degree of a memory block, of which the characteristic has deteriorated by consecutive secure erase operations. Accordingly, a threshold voltage distribution may be appropriately positioned through a program operation, and a read operation may be performed using an optimal read level(s). As a result, data reliability may be increased, and the cases where uncorrectable errors occur in response to a data read operation may be reduced. Accordingly, the frequency of operations for data error recovery (e.g., entering recovery code) may also be reduced, such that read latency may also be decreased.

Figure 2:
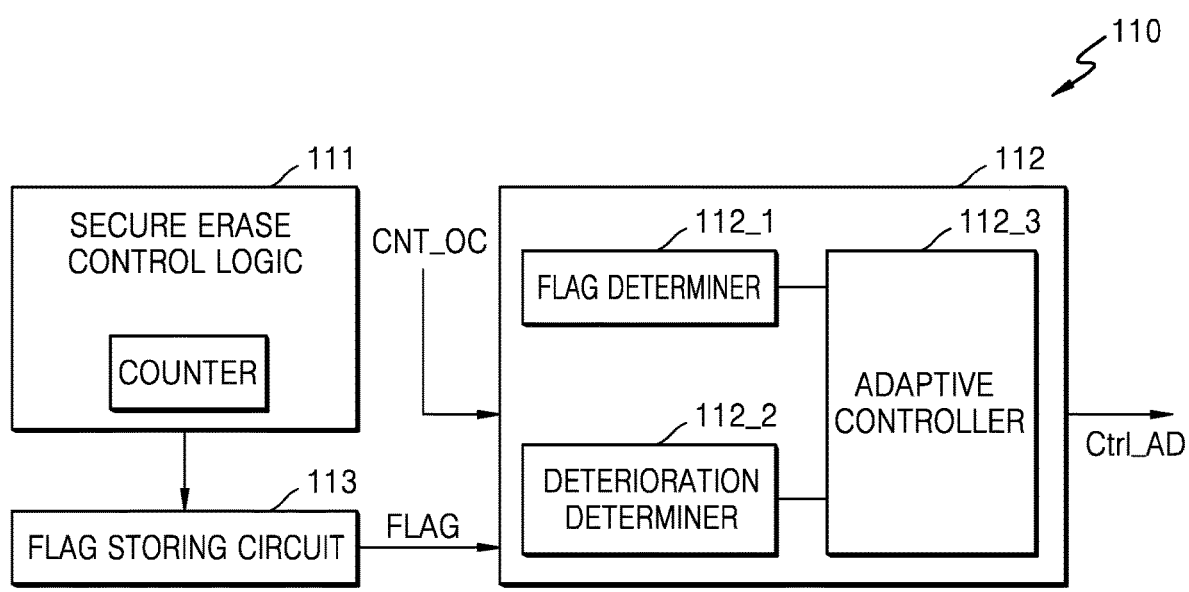
FIG. 2 is a block diagram of an exemplary implementation of a controller in FIG. 1.

FIG. 2 is a block diagram of an implementation of the controller 110 in FIG. 1. Referring to FIG. 2, the controller 110 may include the secure erase control logic 111, the adaptive control logic 112, and a flag storing circuit 113. The secure erase control logic 111 may control a secure erase operation on each memory block as described above and may include an element (e.g., a counter), which may determine a secure erase count for each memory block when a secure erase operation is performed. For example, the secure erase control logic 111 may determine a position of a memory block, for which a secure erase has been requested, and a counter corresponding to the memory block may perform a counting operation.

According to the embodiment described above, the secure erase control logic 111 may change a flag, which corresponds to a memory block having a count value of 2 or a set value of at least 2, to a first value (e.g., "1"), and the flag may be stored in the flag storing circuit 113. In contrast, when a memory block has a count value of 1 or less, the flag may be maintained at a second value (e.g., "0"). In other words, whether a secure erase operation has been performed on a memory block at least two times may be determined based on flags, which are respectively stored in the flag storing circuit 113 in correspondence to memory blocks.

The adaptive control logic 112 may include a flag determiner 112_1, a deterioration determiner 112_2, and an adaptive controller 112_3. The flag determiner 112_1 may determine the flag value and output a signal indicating whether a secure erase operation has been performed on a memory block at least two times. The deterioration determiner 112_2 may output a signal, which indicates the deterioration degree (i.e., level of deterioration) of a memory block, based on at least one piece of information. For example, the deterioration determiner 112_2 may determine the deterioration degree of a memory block based on a count value CNT_OC, which is obtained by counting the number of off-cells among the memory cells of at least one page of the memory block based on a certain read level. Referring to the first memory block, the threshold voltage distribution of the first memory block may be shifted to the left according to the deterioration degree of the first memory block, and accordingly, the number of off-cells among the memory cells of at least one page may be compared with a certain reference value, and the deterioration degree of the first memory block may be determined to be relatively high when the number of off-cells is less than the certain reference value.

The adaptive controller 112_3 may receive a determination result and output the adaptive control signal Ctrl_AD. When a write request is received with respect to the first memory block that has undergone a secure erase operation, an erase operation for shifting the threshold voltage distribution of memory cells of the first memory block to an erase state and a program operation for shifting the threshold voltage distribution to a program state corresponding to data to be written may be sequentially performed. When the flag corresponding to the first memory block is 1, the level of at least one selected from a program voltage and an erase voltage may be adjusted according to the deterioration degree of the first memory block, or at least one selected from a program time (or a program loop count) and an erase time (or an erase loop count) may be adjusted. Alternatively, during a data writing process, a write operation may be performed by controlling the flow of a plurality of operations including an erase operation and a program operation on the first memory block.

Assuming that the adaptive write operation is not used, when a read operation is requested with respect to the first memory block to which user data has been written under normal operating conditions, an adaptive read operation may be performed based on the determination result in the above-described embodiment. For example, when data is written to the first memory block of which the characteristics have deteriorated, the threshold voltage distribution characteristics of memory cells of the first memory block may be different compared to when data is written to a memory block of which the characteristics have not deteriorated. In this case, according to an embodiment, an adaptive read operation may be performed such that the data may be read using an optimal read level.

Although FIG. 2 illustrates an embodiment of determining deterioration based on a result of counting off-cells, embodiments are not limited thereto. The determination may be performed based on a result of counting on-cells. As the threshold voltage distribution of the first memory block is shifted from a secure erase state to the threshold voltage distribution of user data during the adaptive writing process, a flag corresponding to the first memory block may be reset.

Figure 3:
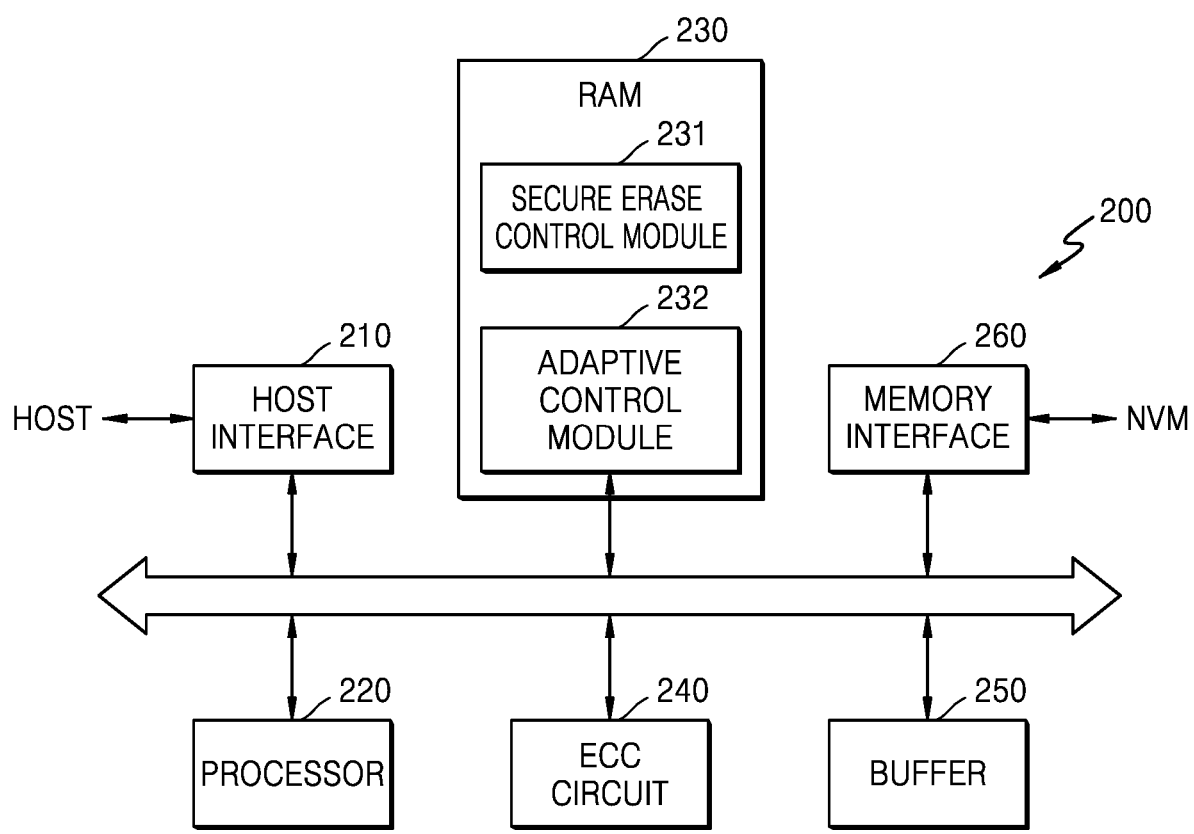
FIG. 3 is a block diagram of an exemplary implementation of a controller according to an example embodiment.

FIG. 3 is a block diagram of an implementation of a controller according to an example embodiment. Referring to FIG. 3, a controller 200 may include a host interface 210, a processor 220, RAM 230, an error correction code (ECC) circuit 240, a buffer 250, and a memory interface 260. The RAM 230 may be used as a working memory. The processor 220 may generally control the operation of the controller 200 by executing firmware loaded to the RAM 230. The RAM 230 may include at least one of various kinds of memory, e.g., cache memory, dynamic RAM (DRAM), static RAM (SRAM), phase-change RAM (PRAM), and flash memory. An FTL may be loaded to the RAM 230 as firmware, and various functions related to flash memory operations may be performed by driving the FTL.

The host interface 210 may communicate with a host via the various interfaces described above. The memory interface 260 may provide physical connection between the controller 200 and an NVM device. A command, an address, data, and the like may be transmitted between the controller 200 and the NVM device via the memory interface 260. Data requested by the host to be written to the NVM device and data read from the NVM device may be temporarily stored in the buffer 250. The ECC circuit 240 may perform ECC encoding and decoding on data to be written and data that has been read and may detect and correct an error in the data. When the secure erase control operation and the adaptive control operation are performed based on software, a secure erase control module 231 and an adaptive control module 232 may, as firmware, include at least one program and may be loaded to the RAM 230 and executed by the processor 220.

Figure 4:
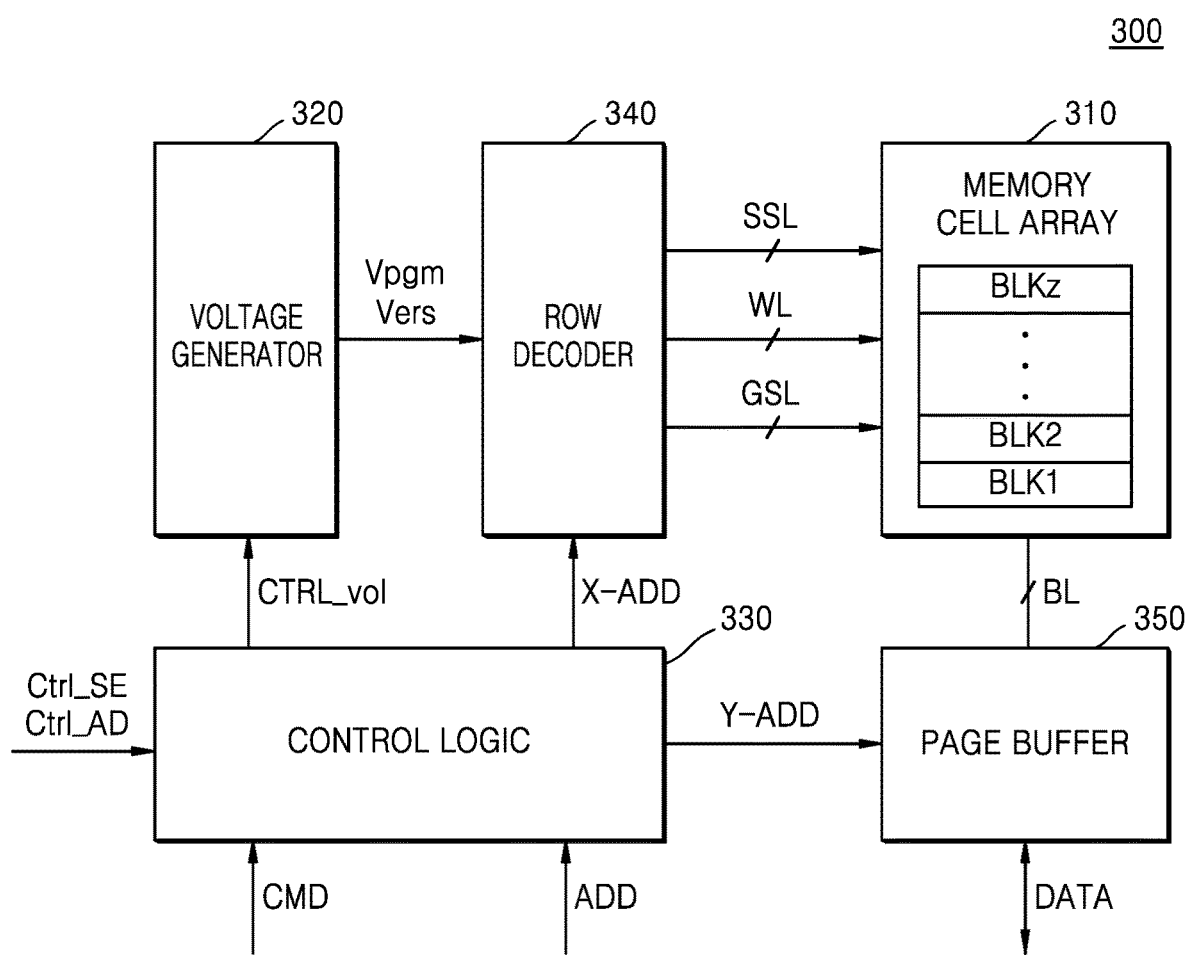
FIG. 4 is a block diagram of an implementation of a non-volatile memory device according to embodiments.

FIG. 4 is a block diagram of an implementation of an NVM device according to embodiments. FIG. 4 illustrates an implementation of a flash memory device as an NVM device. Referring to FIG. 4, an NVM device 300 may include a memory cell array 310, a voltage generator 320, a control logic 330, a row decoder 340, and a page buffer 350. The memory cell array 310 may include a plurality of memory blocks, including first to z-th memory blocks BLK1 to BLKz. The memory cells of the first to z-th memory blocks BLK1 to BLKz may be connected to word lines WL, string selection lines SSL, ground selection lines GSL, and bit lines BL. The memory cell array 310 may be connected to the row decoder 340 through the word lines WL, the string selection lines SSL, and the ground selection lines GSL and connected to the page buffer 350 through the bit lines BL. Each of the memory cells may store one or more bits. For example, each memory cell may correspond to a multi-level cell (MLC), a triple-level cell (TLC), or a quad-level cell (QLC).

The control logic 330 may output various internal control signals for controlling program, read, and erase operations of the memory cell array 310 based on the command CMD, the address ADD, and a control signal, which are received from a controller. For example, the control logic 330 may output a voltage control signal CTRL_vol for controlling the levels of various voltages generated by the voltage generator 320 and provide a row address X-ADD to the row decoder 340 and a column address Y-ADD to the page buffer 350. The voltage generator 320 may generate various voltages used by the NVM device 300. For example, the voltage generator 320 may generate a program voltage Vpgm used for a program operation and an erase voltage Vers used for an erase operation.

According to an example embodiment, the control logic 330 may receive the secure erase control signal Ctrl_SE and the adaptive control signal Ctrl_AD from the controller and may perform a secure erase operation and an adaptive write or read operation on the memory cell array 310 based on the secure erase control signal Ctrl_SE and the adaptive control signal Ctrl_AD. For example, the NVM device 300 may perform a normal write/read operation or a write/read operation under changed operating conditions according to the adaptive control signal Ctrl_AD.

Figure 5:
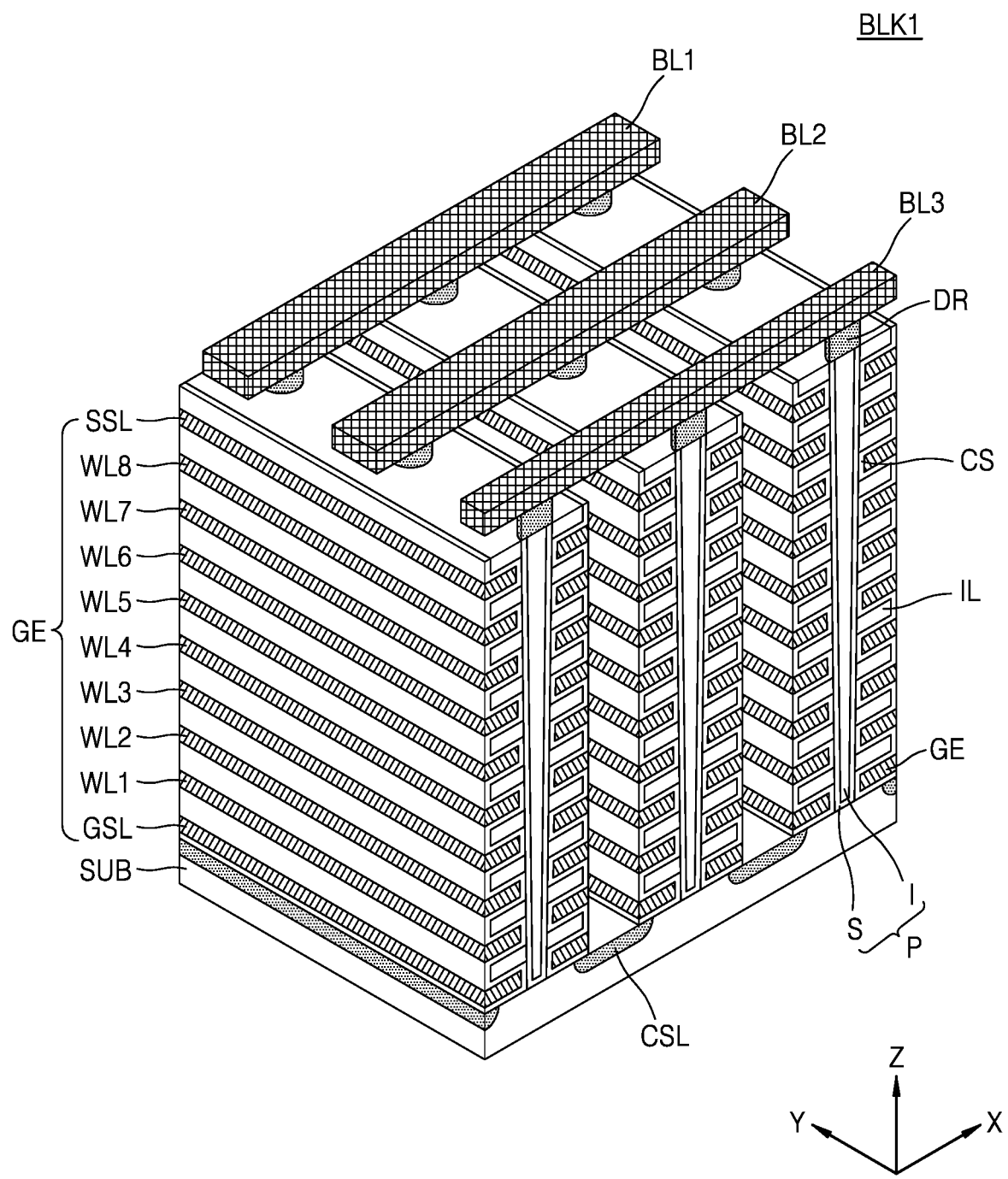
FIG. 5 is a perspective view of a block in FIG. 4, according to an embodiment.

FIG. 5 is a perspective view of the first memory block BLK1 in FIG. 4, according to an embodiment. Referring to FIG. 5, the first memory block BLK1 is vertically formed on a substrate SUB. The substrate SUB has a first conductivity type (e.g., a p-type). A common source line CSL extends in the substrate SUB in a second horizontal direction Y and is doped with impurities of a second conductivity type (e.g., an n-type). In a region of the substrate SUB between two adjacent common source lines CSL, a plurality of insulating layers IL extend in the second horizontal direction Y and are sequentially provided in a vertical direction Z. The insulating layers IL are separated from each other by a certain distance in the vertical direction Z. For example, the insulating layers IL may include an insulating material such as silicon oxide.

In the region of the substrate SUB between two adjacent common source lines CSL, a plurality of pillars P pass through the insulating layers IL in the vertical direction Z. The plurality of pillars P are arranged in a first horizontal direction X. For example, the pillars P pass through the insulating layers IL to be in contact with the substrate SUB. In detail, a surface layer S of each pillar P may include a silicon material of the first conductivity type and may function as a channel region. An inner layer I of each pillar P may include an insulating material such as silicon oxide or an air gap.

In the region between two adjacent common source lines CSL, a charge storage layer CS is provided along the exposed surfaces of the insulating layers IL, the pillars P, and the substrate SUB. The charge storage layer CS may include a gate insulating layer (or referred to as a "tunneling insulating layer"), a charge trap layer, and a blocking insulating layer. For example, the charge storage layer CS may have an oxide-nitride-oxide (ONO) structure. In the region between two adjacent common source lines CSL, gate electrodes GE, such as a ground selection line GSL, a string selection line SSL, and word lines WL1 to WL8, are provided on an exposed surface of the charge storage layer CS.

Drains or drain contacts DR are respectively provided on the pillars P. For example, the drains or drain contacts DR may include a silicon material doped with impurities of the second conductivity type. Bit lines BL1 to BL3 extend on the drains or drain contacts DR in the first horizontal direction X and are separated from each other by a certain distance in the second horizontal direction Y.

Although not shown in FIG. 5, the first memory block BLK1 may include at least one dummy word line. For example, the first memory block BLK1 may further include at least one dummy word line (or upper dummy line) above the word lines WL1 to WL8 and at least one dummy line (or lower dummy line) below the word lines WL1 to WL8. When the threshold voltage distribution of memory cells connected to a dummy word line are shifted to the left because of deterioration of the memory cells, the memory cells connected to the dummy word line may have an excessive turn-on state during data programming, and accordingly, a relatively great current flows compared to when the deterioration of the memory cells are low. As a result, the threshold voltage distribution characteristics of memory cells connected to the word lines WL1 to WL8 may be deteriorated.

Figure 6:
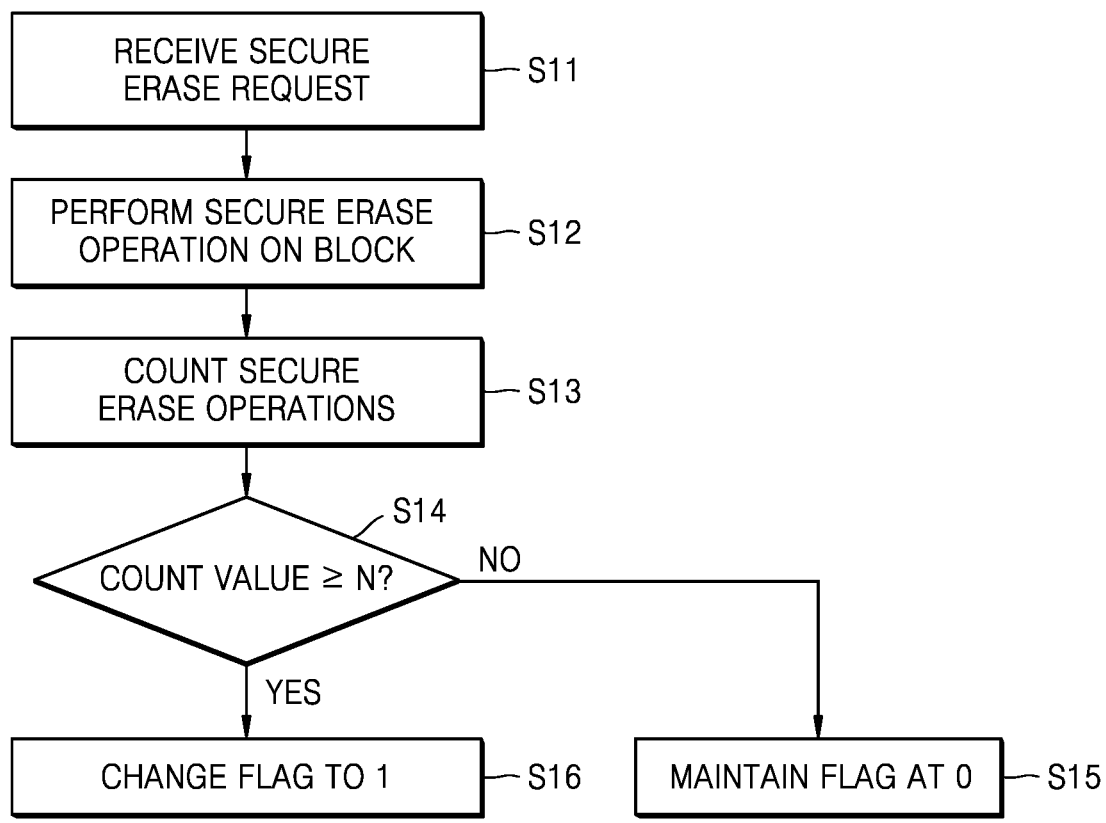
FIGS. 6 and 7 are flowcharts of an operating method of a storage device, according to example embodiments.
Figure 7:
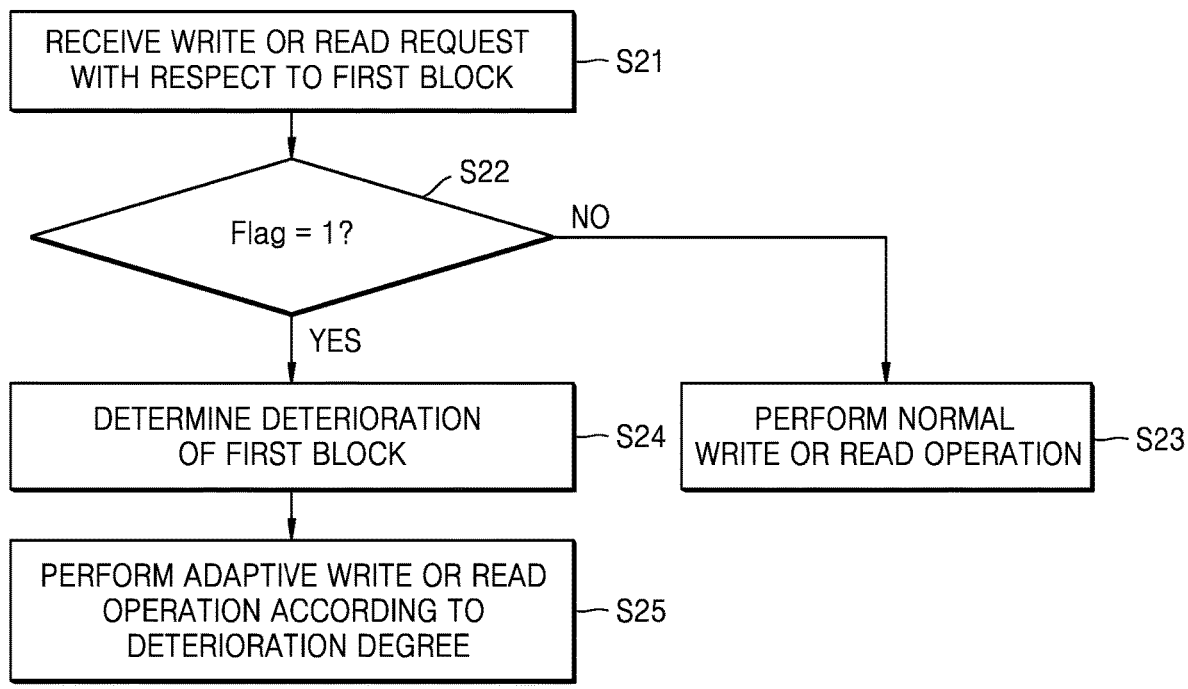

FIGS. 6 and 7 are flowcharts of an operating method of a storage device, according to example embodiments. Referring to FIG. 6, the storage device may include a controller and an NVM device and may receive a secure erase request from a host in operation S11. The storage device may perform a secure erase operation on at least one memory block of the NVM device in response to the secure erase request in operation S12. In an example embodiment, the storage device may perform a secure erase operation on at least one memory block in response to a request from the host. The storage device may count the number of secure erase operations performed on the memory block corresponding to the secure erase request in operation S13. The storage device may determine whether the memory block has a count value of N or greater based on a counting result in operation S14. At this time, N may be an integer of at least 2. When the memory block has a count value less than N, a flag corresponding to the memory block may remain as 0 in operation S15. Otherwise, when the memory block has a count value of N or greater, the flag corresponding to the memory block may be changed to 1 in operation S16.

Referring to FIG. 7, the storage device may receive a write or read request from the host with respect to a first memory block in operation S21 and determine whether a flag corresponding to the first memory block is 1 in operation S22. When it is determined that the flag is not 1 (or is 0), it may indicate that the first memory block is not in a secure erase state or has undergone a secure erase operation once or a relatively small number of times. In this case, a write or read operation may be performed on the first memory block under normal operating conditions. Otherwise, when the flag corresponding to the first memory block is 1, the deterioration degree of the first memory block may be determined based on the deterioration determining method described above in operation S24. According to the deterioration degree, an adaptive write or read operation may be performed on the first memory block under operating conditions different from the normal operating conditions in operation S25.

Figure 8:
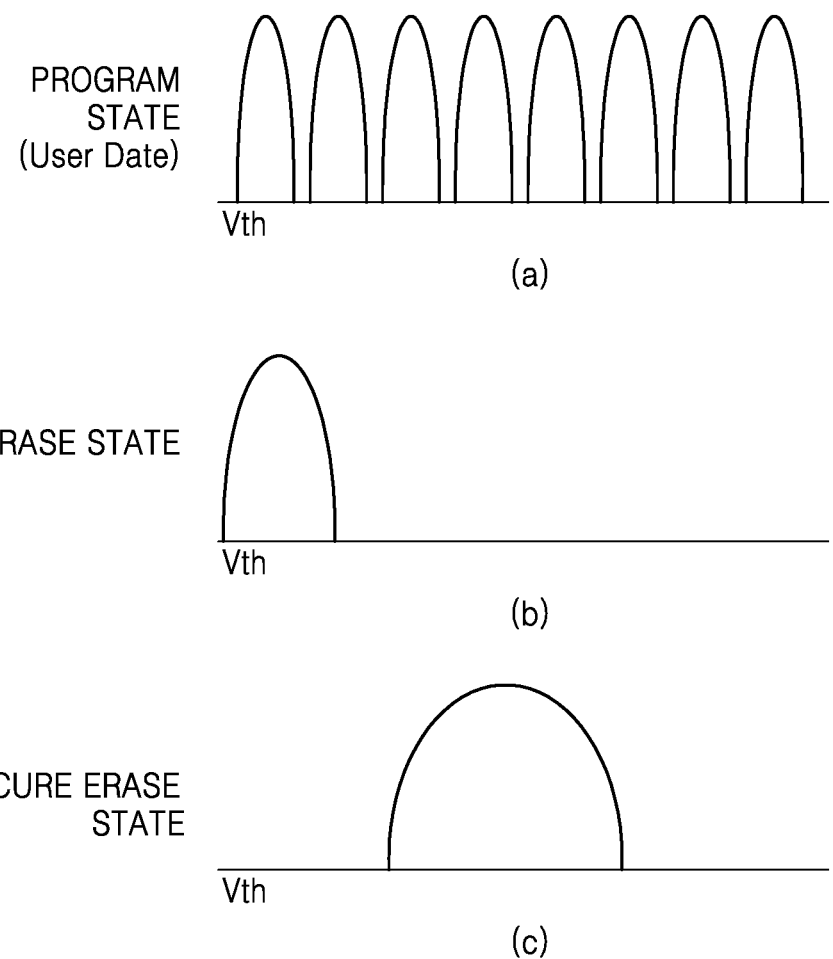
FIG. 8 is a diagram illustrating a threshold voltage distribution according to each state of a storage device.

Hereinafter, specific example operations according to embodiments are described. FIG. 8 is a diagram illustrating a threshold voltage distribution according to each state of a storage device. Referring to FIG. 8, the memory cells of the storage device correspond to TLCs, and accordingly, when user data has been effectively stored in the memory cells, the memory cells have eight threshold voltage distributions. According to an embodiment, a secure erase operation includes an erase operation and a one-shot program operation.

As shown in (a) of FIG. 8, when user data has been effectively stored in memory cells, the memory cells may have multiple threshold voltage distributions having different levels of threshold voltages Vth from each other. As shown in (b) of FIG. 8, when memory cells are in an erase state, the memory cells may have a single threshold voltage distribution corresponding to the erase state. However, as shown in (c) of FIG. 8, when memory cells are in a secure erase state, an erase operation and a one-shot program operation are sequentially performed on the memory cells, and accordingly, the memory cells may have a single threshold voltage distribution having a higher threshold voltage level than in the erase state. When a data write is requested with respect to a memory block that has undergone a secure erase operation including the one-shot program operation, an erase operation may be performed on the memory block, and thereafter, a program operation for forming a threshold voltage distribution corresponding to actual user data may be performed on the memory block.

Figure 9A:
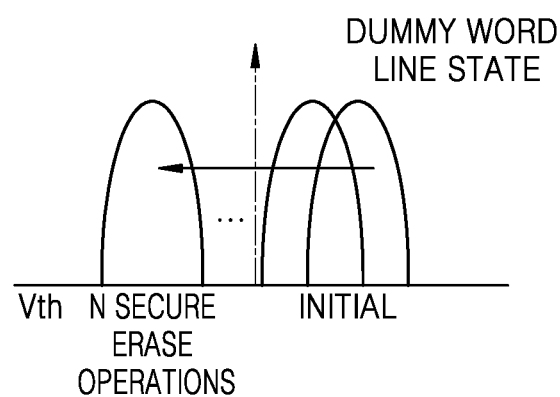
FIGS. 9A and 9B are diagrams illustrating an example of determining the deterioration degree of a memory block.
Figure 9B:
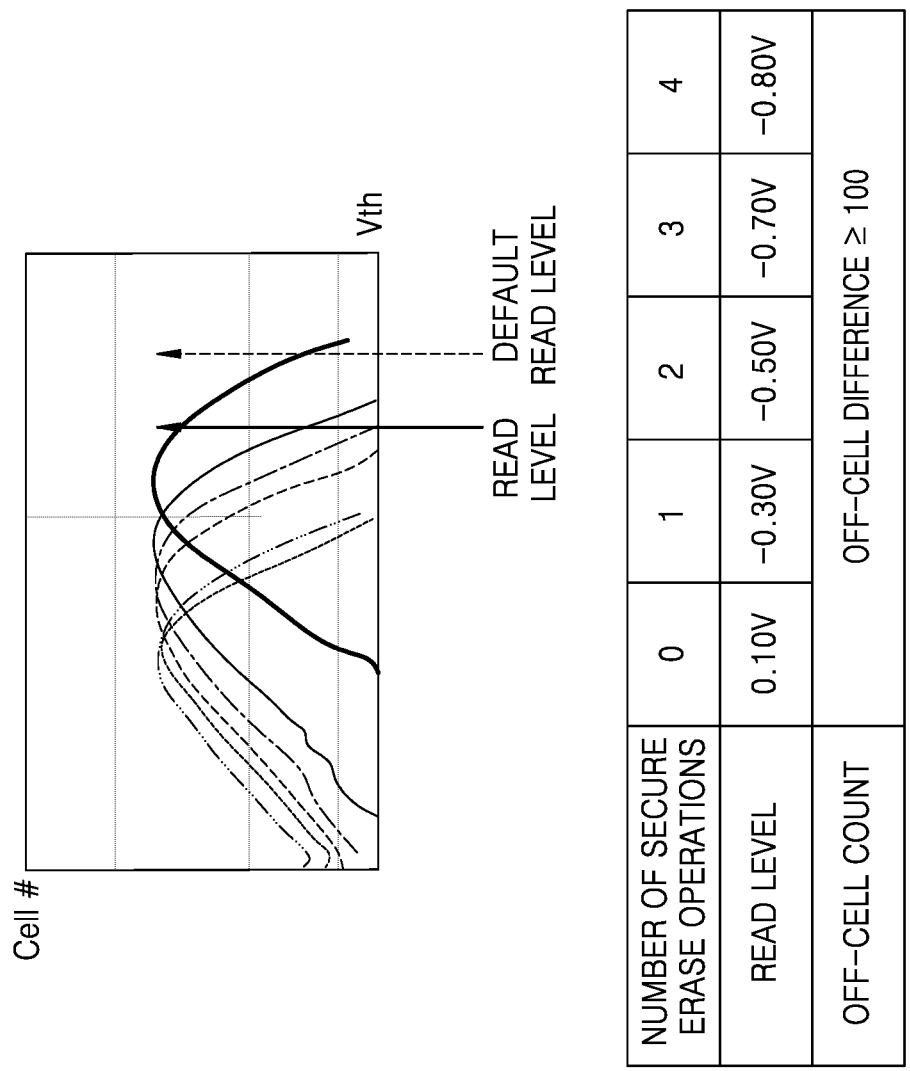

FIGS. 9A and 9B are diagrams illustrating an example of determining the deterioration degree of a memory block. FIGS. 9A and 9B show an example of a threshold voltage distribution of memory cells connected to a dummy word line of a memory block. Referring to FIG. 9A, an erase operation or a program operation is not performed on the dummy word line during a secure erase operation, and accordingly, the memory cells connected to the dummy word line may initially have a single threshold voltage distribution. However, as a secure erase operation is repeatedly performed on the memory block, interference may occur in the memory cells connected to the dummy word line. Accordingly, the threshold voltage distribution of the memory cells connected to the dummy word line may be shifted to the left in response to the secure erase operation.

For example, as the number of secure erase operations performed on the memory block increases to N (where N is an integer of 2 or greater), the amount of shift of the threshold voltage distribution of the memory cells connected to the dummy word line may increase.

FIG. 9B illustrates an example of determining the deterioration degree of the block based on the threshold voltage distribution of the memory cells connected to the dummy word line. In the example of FIG. 9B, a read level is changed based on a default read level during a read operation on the memory cells connected to the dummy word line, and off-cells resulting from the read operation are counted. As shown in FIG. 9B, as the number of secure erase operations performed on the memory block increases, the threshold voltage distribution of the memory cells connected to the dummy word line may be shifted to the left, and the number of off-cells may be differently counted based on a certain read level according to the deterioration degree of the memory cells connected to the dummy word line. For example, the deterioration degree of the memory block may be determined by determining a changed read level, which gives at least a certain value (e.g., 100) as an off-cell difference between the number of off-cells based on the default read level and the number of off-cells based on the changed read level.

The numerical values of the read level in FIG. 9B may correspond to offsets related to the default read level. When a secure erase operation is not performed on the memory block, the threshold voltage distribution of the memory cells connected to the dummy word line is positioned on the rightmost side in the example of FIG. 9B. In a process of performing a read operation while changing the read level, when the read operation is performed using a read level that is 0.1 V higher than the default read level, the off-cell difference may be determined to be 100 or greater. When deterioration occurs due to a secure erase operation performed on the memory block, a read level giving an off-cell difference of at least 100 may gradually decrease. In the case where one secure erase operation has been performed on the memory block, the off-cell difference may be at least 100 when a read operation is performed on the memory block using a read level that is 0.3 V lower than the default read level.

Similarly, in the case where two (2) secure erase operations have been performed on the memory block, the off-cell difference may be at least 100 when a read operation is performed on the memory block using a read level that is 0.5 V lower than the default read level. In the case where three (3) secure erase operations have been performed on the memory block, the off-cell difference may be at least 100 when a read operation is performed on the memory block using a read level that is 0.7 V lower than the default read level. In the case where four secure erase operations have been performed on the memory block, the off-cell difference may be at least 100 when a read operation is performed on the memory block using a read level that is 0.8 V lower than the default read level.

The deterioration degree of the memory cells connected to the dummy word line may be determined based on the read level determined using the method described above. When the deterioration degree of the memory cells connected to the dummy word line is high, it may be determined that the deterioration degree of the memory block including the memory cells is high. Based on a determination result, the adaptive write or read operation may be performed according to the embodiments described above.

Although the numerical values in one case are shown in FIGS. 9A and 9B, embodiments are not limited thereto. The deterioration degree of a memory block may be determined using various methods based on other various values. For example, without changing a read level, off-cells may be counted using one particular read level or a small number of read levels, and the deterioration degree may be determined based on a count value. Although FIGS. 9A and 9B illustrate the case where off-cells are counted among the memory cells connected to the dummy word line, on-cells may be counted among the memory cells connected to the dummy word line, or off-cells (or on-cells) may be counted among memory cells connected to a normal word line.

Figure 10:
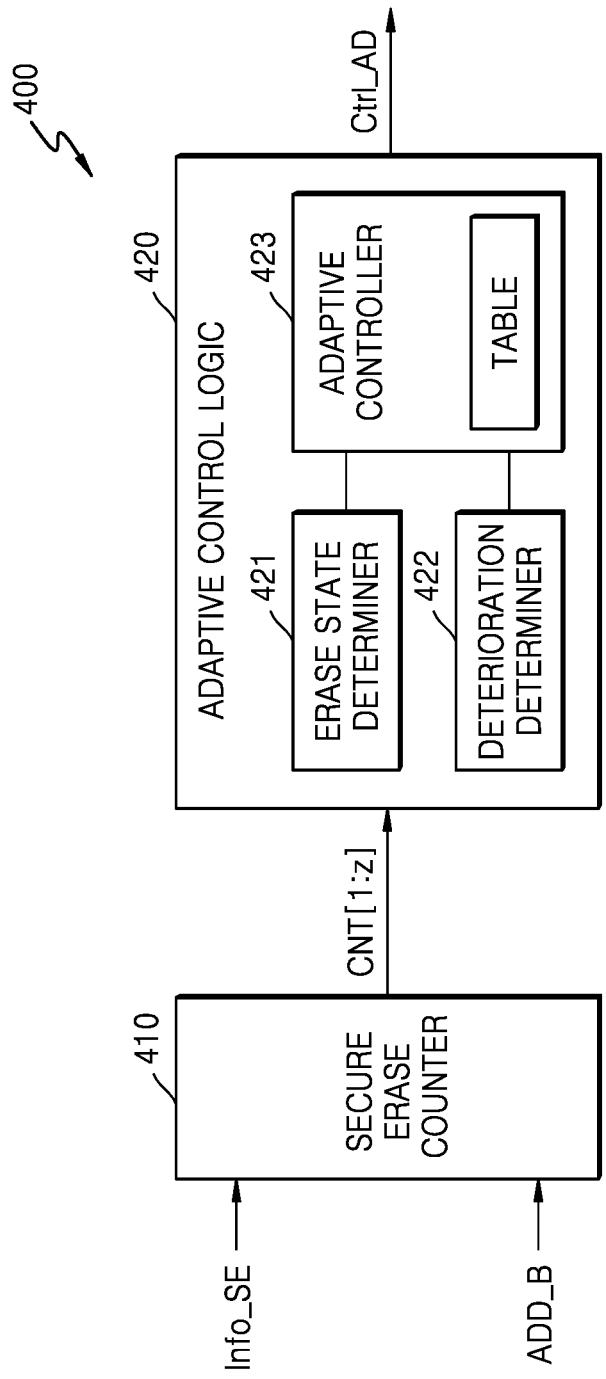
FIG. 10 is a block diagram of a controller according to an example embodiment.

FIG. 10 is a block diagram of a controller according to an example embodiment. FIG. 10 illustrates an example of performing the various determinations described above based on a counting operation without setting a flag. Various elements in FIG. 10 may be implemented by hardware, software, or a combination thereof, and at least some of the various elements may be implemented by firmware executable by a processor. Referring to FIG. 10, a storage device or a controller 400 of the storage device may include a secure erase counter 410 and an adaptive control logic 420. Although not shown in FIG. 10, the controller 400 may further include the secure erase control logic described above.

The secure erase counter 410 may output a count value CNT[1:z], which indicates the number of secure erase operations performed on each of a plurality of memory blocks (e.g., z blocks), to the adaptive control logic 420 based on a counting operation. For example, the secure erase counter 410 may receive secure erase information Info_SE and a block address ADD_B and count the number of secure erase operations on a memory block corresponding to the block address ADD_B.

The adaptive control logic 420 may output the adaptive control signal Ctrl_AD for the above-described adaptive control operation based on the count value CNT[1:z]. For example, the adaptive control logic 420 may include an erase state determiner 421, a deterioration determiner 422, and an adaptive controller 423. The erase state determiner 421 may determine, based on the count value CNT[1:z], whether adaptive control is used during a subsequent data write or read operation. For example, when the count value CNT[1:z] of a memory block is at least N (where N is an integer of at least 2), the erase state determiner 421 may output a signal indicating that adaptive control is used. The deterioration determiner 422 may output a signal, which determines the deterioration degree of a memory block, based on the count value CNT[1:z]. For example, when the count value CNT[1:z] increases, the deterioration degree of the memory block may be determined to increase.

The adaptive controller 423 may change the conditions of a write or read operation on the memory block by outputting the adaptive control signal Ctrl_AD based on the signals from the erase state determiner 421 and the deterioration determiner 422. In an implementation, the adaptive controller 423 may include a table, which stores information about the conditions of at least one selected from write and read operations, and output the adaptive control signal Ctrl_AD based on the information stored in the table.

Figure 11:
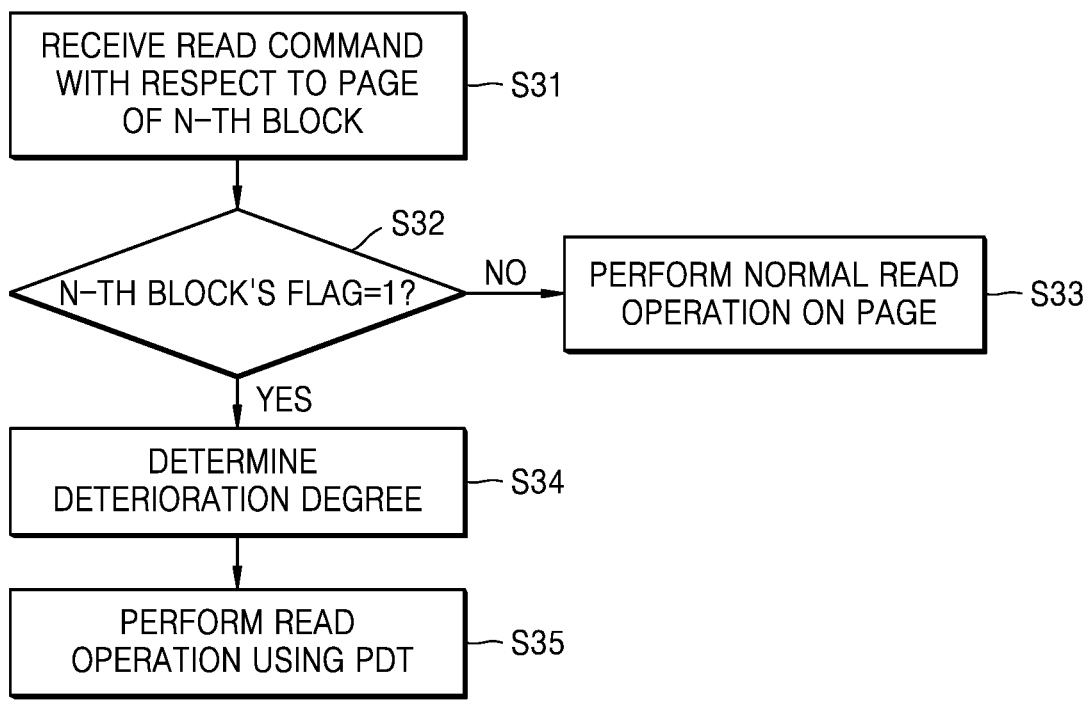
Figure 12B:
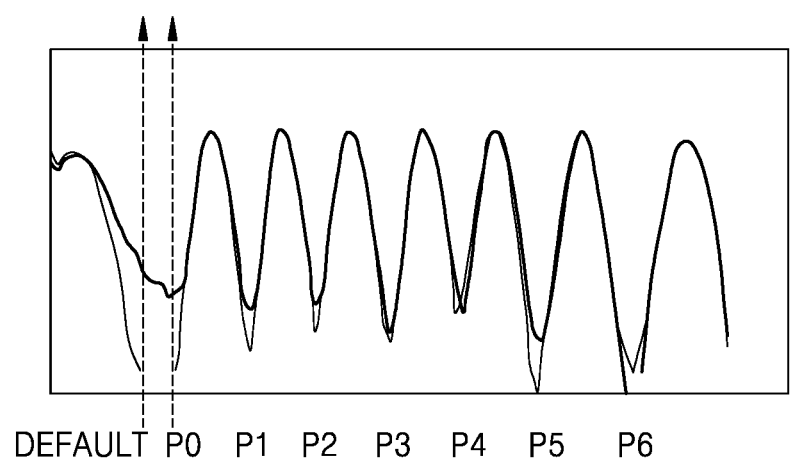

According to embodiments, examples of applying adaptive control to write and read operations are described below. FIG. 11 and FIGS. 12A and 12B illustrate an adaptive control method in a read operation. Referring to FIG. 11, a storage device may receive a read request or a read command with respect to a page of a memory block (e.g., an N-th memory block) among a plurality of memory blocks in operation S31 and determine whether a flag corresponding to the N-th memory block is 1 in operation S32. When the flag corresponding to the N-th memory block is not 1, a read operation may be performed on the page of the N-th memory block under normal operating conditions in operation S33.

Otherwise, when the flag corresponding to the N-th memory block is 1, the deterioration degree of the N-th memory block may be determined using various methods in operation S34. For example, the deterioration degree of the N-th memory block may be determined based on a result of analyzing the threshold voltage distribution of the N-th memory block. The storage device may read information about reading conditions from a pre-defined table (PDT) that stores various kinds of information about adaptive control and perform a read operation on the page based on the information read from the PDT in operation S35. The read operation may be performed on the page on the basis of different read levels according to deterioration degrees.

FIG. 12A shows an example of information stored in the PDT, and FIG. 12B shows an example of an adaptive read level for each state of a multi-level cell, e.g., a TLC. Referring to FIG. 12A, a read level for each state under normal operating conditions is defined as a default read level, and the value of an adaptive read level indicates an offset from the default read level.

According to the embodiments described above, when the flag corresponding to the N-th memory block is 1, each of states P0 to P6 may be determined based on adaptive read level information stored in the PDT. For example, the state P0 of a first threshold voltage distribution on the leftmost side may be determined through a read operation using a read level that is 200 mV higher than a default read level. The state P1 of a second threshold voltage distribution may be determined through a read operation using a read level that is 100 mV higher than the default read level. In the case of the state P6 of a seventh threshold voltage distribution, the shift of the seventh threshold voltage distribution is substantially small, and accordingly, the seventh threshold voltage distribution may be determined through a read operation using the default read level.

Figure 13:
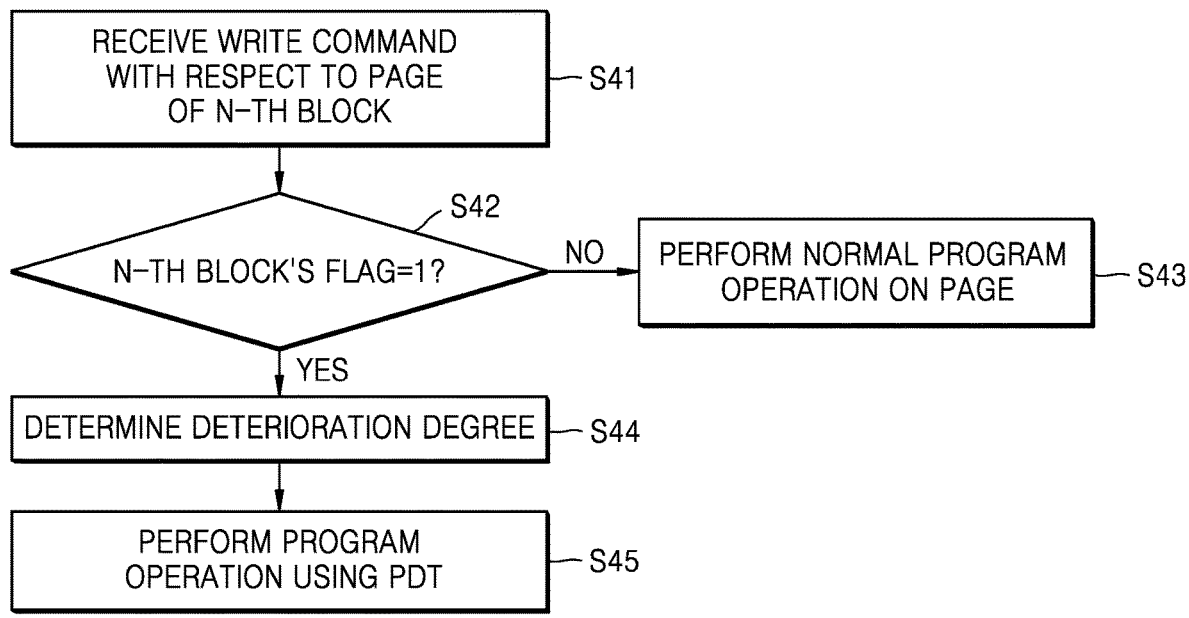
Figure 15:
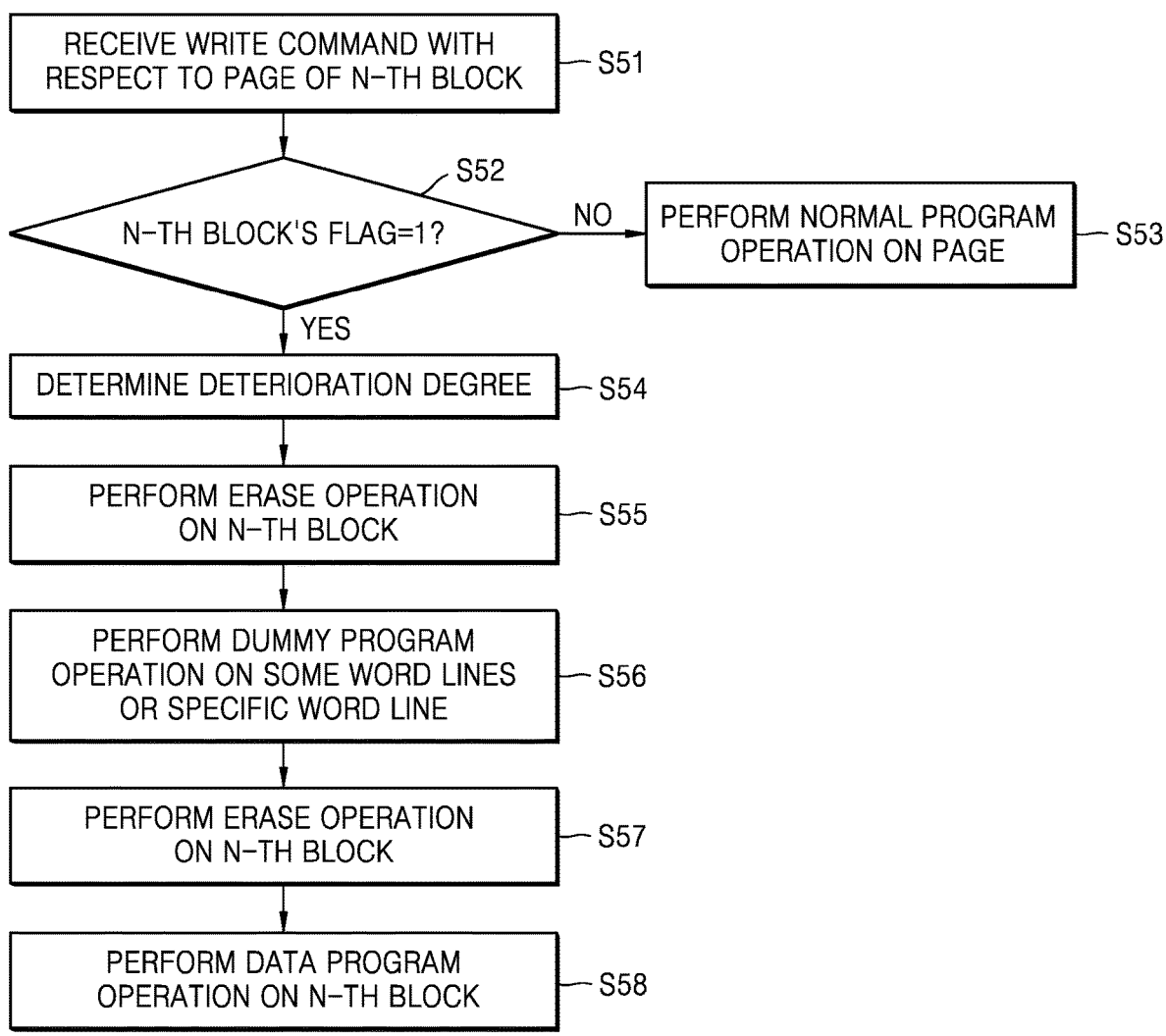

FIGS. 13 through 15 illustrate an adaptive control method in a program operation. Referring to FIG. 13, a storage device may receive a write request (or a write command) with respect to a page of a memory block (e.g., the N-th memory block) among a plurality of memory blocks in operation S41 and determine whether a flag corresponding to the N-th memory block is 1 in operation S42. When the flag corresponding to the N-th memory block is not 1, a program operation may be performed on the page of the N-th memory block under normal operating conditions in operation S43.

Otherwise, when the flag corresponding to the N-th memory block is 1, the deterioration degree of the N-th memory block may be determined using various methods, as described above, in operation S44. The storage device may perform a program operation on the page using write operation-related information stored in a PDT in operation S45. For example, the write operation may include erase and program operations on the N-th memory block, and adaptive control may be applied to at least one selected from the erase operation and the program operation. For example, at least one condition selected from an erase voltage, a program voltage, an erase time (or an erase loop count), and a program time (or a program loop count) may be changed, and the write operation may be performed based on the selected condition according to the deterioration degree.

FIG. 14 shows an example of table information related to a write operation, according to an example embodiment. FIG. 14 shows examples of the number of secure erase operations as references indicating deterioration degrees. The numerical values in FIG. 14 may correspond to offsets from an erase voltage, a program voltage, an erase time, and a program time of a normal secure erase operation.

Referring to FIG. 14, in the case of a memory block on which consecutive secure erase operations have been performed, the threshold voltage distribution of the memory block tends to shift to the left, and accordingly, operating conditions may be set such that the threshold voltage distribution of the memory block is positioned further to the right in an adaptive write operation than in a normal write operation. For example, when the respective values of the erase voltage Vers, an erase time, the program voltage Vpgm, and a program time of a normal secure erase operation are defined as default values, offsets may be set differently according the deterioration degree of a memory block by a secure erase operation. For example, when no secure erase operation has been performed on the first memory block, a secure erase operation may be performed according to the erase voltage Vers, the erase time, the program voltage Vpgm, and the program time, which respectively correspond to the default values.

However, when the deterioration of a memory block, for which a write is requested, increases, the level of the erase voltage Vers may be decreased from a default value. FIG. 14 shows an example in which the level of the erase voltage Vers is decreased 100 mV or 200 mV from the default value. As the level of the erase voltage Vers is decreased, the amount of shift to the left of the threshold voltage distribution of memory cells by an erase operation may be decreased. In addition, as the deterioration of the memory block increases, the erase time (or the erase loop count) may be reduced. As the erase time or the erase loop count is reduced, the amount of shift to the left of the threshold voltage distribution of the memory cells by the erase operation may be decreased.

Moreover, as the deterioration of the memory block increases, the level of the program voltage Vpgm may be increased from a default value. FIG. 14 shows an example in which the level of the program voltage Vpgm is increased 50 mV or 100 mV from the default value. As the level of the program voltage Vpgm is increased, the amount of shift to the right of the threshold voltage distribution of memory cells by a program operation may be increased. In addition, as the deterioration of the memory block increases, the program time (or the program loop count) may be increased. As the program time or the program loop count is increased, the amount of shift to the right of the threshold voltage distribution of the memory cells by the program operation may be increased.

FIG. 15 shows an example of controlling an operation flow of a write operation during an adaptive writing process. Referring to FIG. 15, a storage device may receive a write request (or a write command) with respect to a page of a memory block (e.g., the N-th memory block) among a plurality of memory blocks in operation S51 and determine whether a flag corresponding to the N-th memory block is 1 in operation S52. When the flag corresponding to the N-th memory block is not 1, a program operation may be performed on the page of the N-th memory block under normal operating conditions in operation S53. Otherwise, when the flag corresponding to the N-th memory block is 1, the deterioration degree of the N-th memory block may be determined using various methods, as described above, in operation S54.

According to the deterioration degree of the N-th memory block, various operations may be sequentially performed in the adaptive writing process. When an erase operation is performed on the N-th memory block in operation S55, the memory cells of the N-th memory block may have a threshold voltage distribution corresponding to an erase state. Thereafter, a program operation (e.g., a dummy program operation) may be performed such that memory cells connected to at least some word lines of the N-th memory block are programmed to a certain threshold voltage distribution in operation S56, or a dummy program operation may be performed on only a certain word line (e.g., a dummy word line) among the word lines of the N-th memory block in operation S56. For example, the dummy program operation on the N-th memory block may include a program operation for shifting the threshold voltage distribution of the memory cells of the N-th memory block to a distribution corresponding to the case where deterioration has not occurred. Alternatively, the dummy program operation on the dummy word line may include a program operation for increasing the threshold voltage level of memory cells connected to the dummy word line to a distribution before deterioration occurs.

After the dummy program operation described above is completed, an erase operation and a data program operation may be sequentially performed to store valid user data in the N-th memory block in operations S57 and S58. According to an example embodiment, the erase operation on the N-th memory block in operation S55 may not be included in the adaptive writing process.

Figure 16A:
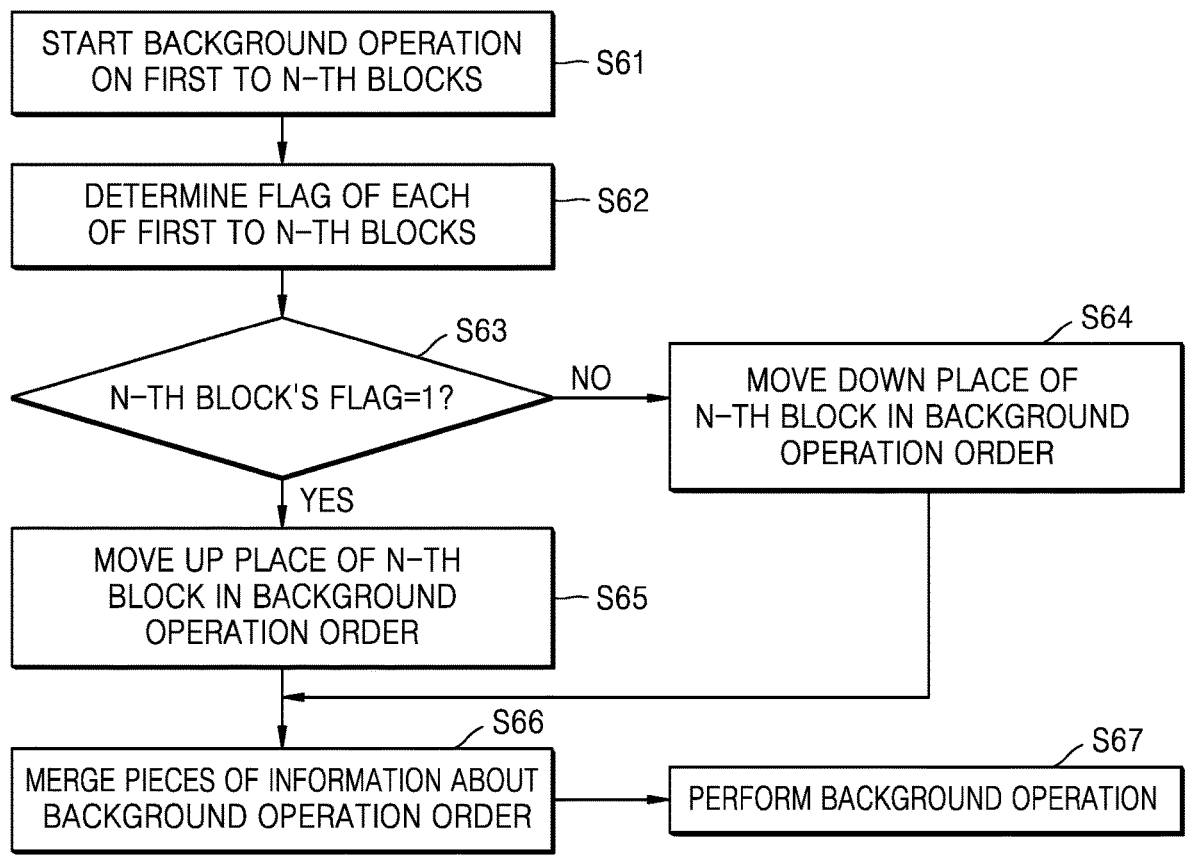
FIGS. 16A and 16B are diagrams of an example operation of a storage device, according to example embodiments.
Figure 16B:
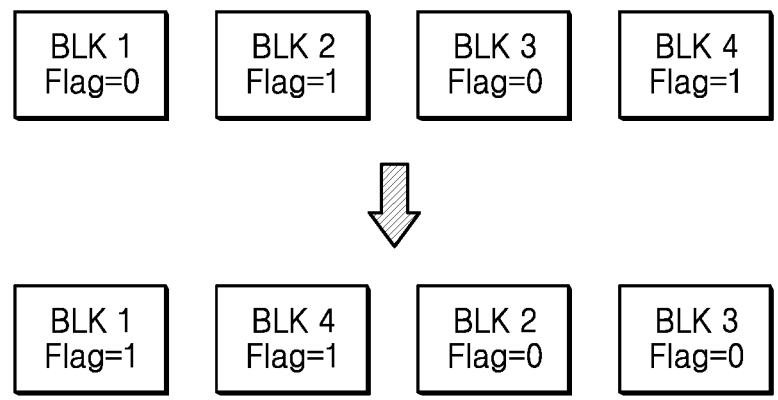

FIGS. 16A and 16B are diagrams of an example operation of a storage device, according to example embodiments. FIGS. 16A and 16B show an example of using a flag in a background operation of a storage device. The storage device may perform a background operation related to the improvement of data reliability in a period during which user data is neither written nor read. Examples of a background operation may include garbage collection, bad block management, read reclaim, and read replacement. At this time, the background operation includes operations for increasing the reliability of deteriorated data. Accordingly, an example of performing a background operation first on a memory block, which has a relatively high likelihood of deterioration, based on the flag values of memory blocks is described.

A controller of the storage device may determine whether a background operation on the first to N-th memory blocks is started in operation S61. As the background operation on the first to N-th memory blocks is started, the controller may determine flags respectively corresponding to the first to N-th memory blocks in operation S62 and set a background operation order of the first to N-th memory blocks based on a result of determining the flags. For example, when the flag of the N-th memory block is not 1, the place of the N-th memory block in the background operation order may be moved down in operation S64. Otherwise, when the flag of the N-th memory block is 1, the place of the N-th memory block in the background operation order may be moved up in operation S65.

Pieces of information about moving down and up the background operation order of the first to N-th memory blocks according to the flags of the first to N-th memory blocks may be merged with each other in operation S66, and accordingly, the background operation order of the first to N-th memory blocks may be determined. The background operation may be performed on the first to N-th memory blocks according to the background operation order in operation S67. FIG. 16B shows the case where the background operation is performed sequentially on the first to fourth memory blocks BLK1 to BLK4 and the case where the background operation order is changed to an order of the first memory block BLK1, the fourth memory block BLK4, the second memory block BLK2, and the third memory block BLK3 based on flag information, according to an example embodiment.

Figure 17:
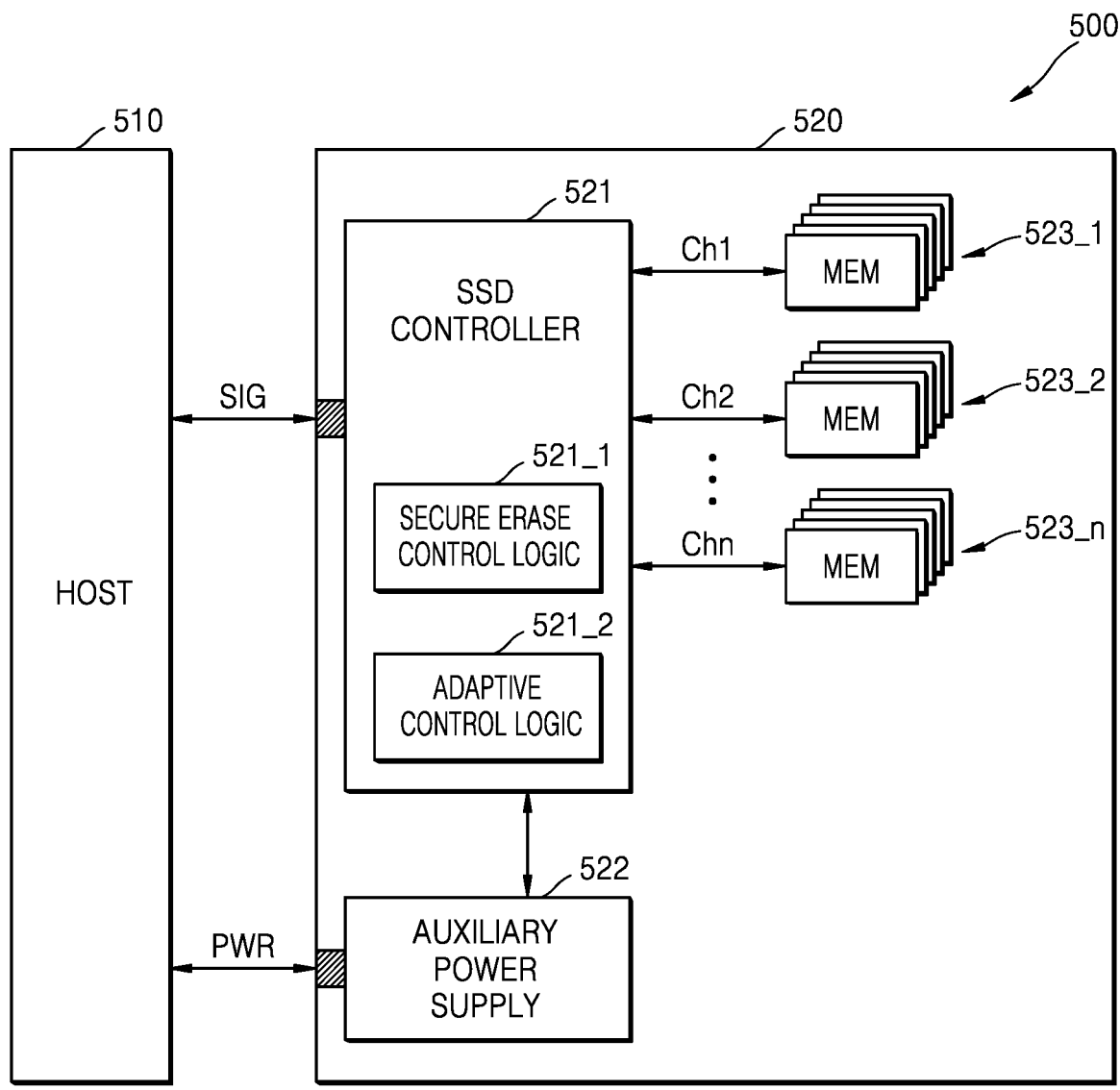
FIG. 17 is a block diagram of an example of applying a storage device to a solid state drive (SSD) system, according to embodiments.

FIG. 17 is a block diagram of an example of applying a storage device to a solid state drive (SSD) system, according to embodiments. Referring to FIG. 17, an SSD system 500 may include a host 510 and an SSD 520. The SSD 520 may exchange signals SIG with the host 510 through a signal connector and may receive power PWR through a power connector. The SSD 520 may include an SSD controller 521, an auxiliary power supply 522, and NVM devices 523_1 to 523_n. The NVM devices 523_1 to 523_n may include NAND flash memory. At this time, the SSD 520 may be implemented using the embodiments described above with reference to FIGS. 1 to 16. In other words, the SSD controller 521 of the SSD 520 may include a secure erase control logic 521_1 and an adaptive control logic 521_2, according to the embodiments described above. The secure erase control logic 521_1 may control a secure erase operation on the NVM devices 523_1 to 523_n in response to a secure erase request from the host 510, and the adaptive control logic 521_2 may control adaptive write and read operations according to the deterioration of memory blocks. According to the embodiments described above, the adaptive control logic 521_2 may include a table, which stores various kinds of information for adaptive control related to data write and read, and perform a control operation based on the information stored in the table.

While the inventive concept has been particularly shown and described with reference to embodiments thereof, it will be understood that various changes in form and details may be made therein without departing from the spirit and scope of the following claims.

What is claimed is:

1. A storage device, comprising
a controller configured to control a non-volatile memory device(s) having a plurality of memory blocks therein, said controller comprising:
secure erase control logic configured to: (i) control secure erase operations on the plurality of memory blocks in response to a secure erase request received from a host, and (ii) set flags corresponding to the plurality of memory blocks such that a first flag corresponding to a first memory block, which has undergone at least two of the secure erase operations, has a first value; and
adaptive control logic configured to change at least one operating condition associated with a write operation and/or read operation directed at the first memory block, in response to detecting that the first flag has the first value.

2. The storage device of claim 1, wherein the controller is further configured to includes a flag storing circuit for storing the flags set by the secure erase control logic.

3. The storage device of claim 1, wherein the controller is configured to set the first flag corresponding to the first memory block to the first value when at least two consecutive secure erase operations have been performed on the first memory block.

4. The storage device of claim 1, wherein the secure erase control logic is further configured to reset the first flag in response to performance of a write operation on the first memory block using the changed at least one operating condition.

5. The storage device of claim 1, wherein the adaptive control logic includes:
a flag determiner configured to determine deterioration of the plurality of memory blocks based on their corresponding flags; and
a deterioration determiner configured to determine a deterioration degree of each of the plurality of memory blocks according to a threshold voltage distribution of memory cells of each of the plurality of memory blocks;
wherein the adaptive control logic is further configured to differentially change the at least one operating condition associated with a write operation and/or read operation for the first memory block, according to the deterioration degree associated with the first memory block.

6. The storage device of claim 5, wherein the first memory block includes at least one dummy word line and a plurality of normal word lines; and wherein the deterioration degree of the first memory block is determined according to an amount of leftward shift of a threshold voltage distribution of memory cells connected to the at least one dummy word line of the first memory block.

7. The storage device of claim 1, wherein the adaptive control logic includes a table, which is configured to store at least one piece of information related to the operating condition; and wherein a read level for determining a data state during the read operation is changed based on the information stored in the table when the first flag corresponding to the first memory block has the first value.

8. The storage device of claim 1, wherein the adaptive control logic includes a table storing at least one piece of information related to the at least one operating condition; wherein the write operation includes performing an erase operation on memory cells of the first memory block and a program operation for programming memory cells of at least one page of the first memory block after the erase operation; and wherein at least one of an erase voltage and a program voltage is changed during the write operation based on the information stored in the table when the first flag corresponding to the first memory block has the first value.

9. The storage device of claim 8, wherein when the first flag corresponding to the first memory block has the first value, a magnitude of the erase voltage is decreased and/or a magnitude of the program voltage is increased, as compared to a normal write operation.

10. The storage device of claim 1, wherein the at least one operating condition corresponds to a plurality of sequential operations performed in response to a write request; and wherein when the first flag corresponding to the first memory block has the first value, a dummy program operation on at least one page of the first memory block, an erase operation on the first memory block, and a program operation on one or more pages of the first memory block requested to be written are sequentially performed in response to the write request.

11. An operating method of a storage device controlling a memory operation of a non-volatile memory device including a plurality of blocks, the operating method comprising:
performing a secure erase operation on the plurality of blocks in response to a secure erase request received from a host;
setting flags respectively corresponding to the plurality of blocks such that a flag corresponding to a first block of the plurality of blocks that has been requested to undergo at least two consecutive secure erase operations has a first value; and
performing a write operation and/or a read operation on the first block after changing at least one operating condition compared to a normal write operation or a normal read operation when a flag corresponding to the first block has the first value.

12. The operating method of claim 11, further comprising reading the flag corresponding to the first block from a flag storing circuit; and wherein the storage device includes the flag storing circuit configured to store the flags associated with the plurality of blocks.

13. The operating method of claim 11, further comprising resetting the flag corresponding to the first block to a second value after performing the write operation on the first block based on a changed operating condition.

14. The operating method of claim 11, further comprising:
determining a deterioration degree of the first block based on a threshold voltage distribution of memory cells connected to a dummy word line of the first block when the flag corresponding to the first block has the first value; and
wherein the operating condition for the first block is differentially changed according to the deterioration degree.

15. The operating method of claim 11, wherein the write operation on the first block includes an erase operation on memory cells of the first block and a program operation for programming memory cells of at least one page of the first block after the erase operation; and wherein when the flag corresponding to the first block has the first value, a magnitude of an erase voltage is decreased in the erase operation or a magnitude of a program voltage is increased in the program operation, compared to the normal write operation.

16. The operating method of claim 11, wherein when the flag corresponding to the first block has the first value, a read voltage for determining a data state is changed in the read operation on the first block.

17. The operating method of claim 16, wherein each of memory cells of the plurality of blocks includes a multi-level cell storing at least two bits of data; and wherein a read voltage for distinguishing between an erase state and a program state is increased in the read operation on the first block, compared to the normal read operation.

18. A method of operating a nonvolatile memory device, comprising:
performing a normal write operation on a first memory block within the nonvolatile memory device; then
performing a secure erase operation on the first memory block by performing a plurality of consecutive erase operations on the first memory block, and setting a flag associated with the first memory block, which indicates that the first memory block has undergone the secure erase operation; and then
performing a modified write operation on the first memory block using at least one modified write operating condition relative to the normal write operation, in response to detecting the set flag associated with the first memory block.

19. The method of claim 18, wherein said performing a modified write operation comprises resetting the flag associated with the first memory block; and wherein said performing a modified write operation is followed by performing a normal write operation on the first memory block.

20. The method of claim 18, wherein the at least one modified write operating condition accounts for an over-erase condition within the first memory block, which is caused by the secure erase operation.

* * * * *